(12) United States Patent
Lin

(10) Patent No.: US 6,406,939 B1
(45) Date of Patent: *Jun. 18, 2002

(54) FLIP CHIP ASSEMBLY WITH VIA INTERCONNECTION

(76) Inventor: Charles W. C. Lin, 55 Cairnhill Road, #21-04 Cairnhill Plaza, Singapore 229666 (SG)

( * ) Notice: Subject to any disclaimer, the term of this patent is extended or adjusted under 35 U.S.C. 154(b) by 0 days.

This patent is subject to a terminal disclaimer.

(21) Appl. No.: 09/852,822

(22) Filed: May 10, 2001

Related U.S. Application Data

(62) Division of application No. 09/120,408, filed on Jul. 22, 1998.

(30) Foreign Application Priority Data

May 2, 1998 (SG) ............................................. 9800994-7

(51) Int. Cl.⁷ ............................................... H01L 21/44
(52) U.S. Cl. ....................................... 438/108; 438/667
(58) Field of Search .................................. 438/108, 667

(56) References Cited

U.S. PATENT DOCUMENTS

| | | | |
|---|---|---|---|
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,074,947 A | 12/1991 | Estes et al. | 156/307.3 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |
| 5,167,992 A | 12/1992 | Lin et al. | 427/437 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Issacs et al. | 228/180.2 |
| 5,284,796 A | 2/1994 | Nakanishi et al. | 437/183 |
| 5,293,067 A | 3/1994 | Thompson et al. | 257/668 |
| 5,327,010 A | 7/1994 | Uenaka et al. | 257/679 |

(List continued on next page.)

FOREIGN PATENT DOCUMENTS

| | | | |
|---|---|---|---|
| EP | 0 718 882 A1 | 6/1996 | H01L/23/057 |
| WO | WO 97/38563 | 10/1997 | H05K/1/03 |

OTHER PUBLICATIONS

Markstein et al., "Controlling the Variables in Stencil Printing," Electronic Packaging & Production, Feb. 1997, pp. 48–56.

Elenius, "Choosing a Flip Chip Bumping Supplier—Technology an IC Package contractor should look for," Advanced Packaging, Mar./Apr. 1998, pp. 70–73.

Erickson, "Wafer Bumping: The Missing Link for DCA," Electronic Packaging & Production, Jul. 1998, pp. 43–46.

Kuchenmeister et al., "Film Chip Interconnection Systems Prepared By Wet Chemical Metallization," IEEE publication 0–7803–4526–6/98, Jun. 1998, 5 pages.

Primary Examiner—David L. Talbott
Assistant Examiner—David A Zarneke
(74) Attorney, Agent, or Firm—David M. Sigmond

(57) ABSTRACT

A flip chip assembly, and methods of forming the same, including a single layer or multilayer substrate in which via holes serve as connections between a semiconductor chip and the substrate. The assembling steps comprise attaching a chip to a substrate having a plurality of via holes for connecting respective traces on the substrate with respective input/output terminal pads of the chip. The via holes are aligned with and placed on top of the pads so that the pads are exposed through the opposite side of the substrate. Electrically conductive material is subsequently deposited in the via holes as well as on the surface of the pads to provide electrical connections between the pads and the traces. Electrically conductive materials include electroless plated metals, electrochemical plated metals, solders, epoxies and conductive polymers.

120 Claims, 5 Drawing Sheets

U.S. PATENT DOCUMENTS

| | | | | |
|---|---|---|---|---|
| 5,334,804 | A | 8/1994 | Love et al. | 174/267 |
| 5,346,750 | A | 9/1994 | Hatakeyama et al. | 428/209 |
| 5,355,283 | A | 10/1994 | Marrs et al. | 361/760 |
| 5,358,621 | A | 10/1994 | Oyama | 205/123 |
| 5,397,921 | A | 3/1995 | Karnezos | 257/779 |
| 5,407,864 | A | 4/1995 | Kim | 437/203 |
| 5,424,245 | A | 6/1995 | Gurtler et al. | 437/183 |
| 5,438,477 | A | 8/1995 | Pasch | 361/689 |
| 5,439,162 | A | 8/1995 | George et al. | 228/180.22 |
| 5,447,886 | A | 9/1995 | Rai | 437/183 |
| 5,454,161 | A | 10/1995 | Beilin et al. | 29/852 |
| 5,454,928 | A | 10/1995 | Rogers et al. | 205/125 |
| 5,475,236 | A | 12/1995 | Yoshizaki | 257/48 |
| 5,477,933 | A | 12/1995 | Nguyen | 174/262 |
| 5,478,007 | A | 12/1995 | Marrs | 228/180.22 |
| 5,483,421 | A | 1/1996 | Gedney et al. | 361/771 |
| 5,484,647 | A | 1/1996 | Nakatani et al. | 428/209 |
| 5,487,218 | A | 1/1996 | Bhatt et al. | 29/852 |
| 5,489,804 | A | 2/1996 | Pasch | 257/778 |
| 5,493,096 | A | 2/1996 | Koh | 219/121.71 |
| 5,508,229 | A | 4/1996 | Baker | 437/183 |
| 5,525,065 | A | 6/1996 | Sobhani | 439/67 |
| 5,536,973 | A | 7/1996 | Yamaji | 257/737 |
| 5,542,601 | A | 8/1996 | Fallon et al. | 228/119 |
| 5,547,740 | A | 8/1996 | Higdon et al. | 428/209 |
| 5,556,810 | A | 9/1996 | Fujitsu | 437/209 |
| 5,556,814 | A | 9/1996 | Inoue et al. | 437/230 |
| 5,564,181 | A | 10/1996 | Dineen et al. | 29/841 |
| 5,572,069 | A | 11/1996 | Schneider | 257/690 |
| 5,576,052 | A | 11/1996 | Arledge et al. | 427/98 |
| 5,583,073 | A | 12/1996 | Lin et al. | 439/183 |
| 5,595,943 | A | 1/1997 | Itabashi et al. | 437/230 |
| 5,599,744 | A | 2/1997 | Koh et al. | 437/195 |
| 5,611,140 | A | 3/1997 | Kulesza et al. | 29/832 |
| 5,611,884 | A | 3/1997 | Bearinger et al. | 156/325 |
| 5,613,296 | A | 3/1997 | Kurino et al. | 29/852 |
| 5,614,114 | A | 3/1997 | Owen | 219/121.66 |
| 5,615,477 | A | 4/1997 | Sweitzer | 29/840 |
| 5,619,791 | A | 4/1997 | Lambrecht, Jr. et al. | 29/852 |
| 5,627,405 | A | 5/1997 | Chillara | 257/668 |
| 5,627,406 | A | 5/1997 | Pace | 257/700 |
| 5,633,204 | A | 5/1997 | Tago et al. | 438/614 |
| 5,637,920 | A | 6/1997 | Loo | 257/700 |
| 5,641,113 | A | 6/1997 | Somaki et al. | 228/180.22 |
| 5,645,628 | A | 7/1997 | Endo et al. | 106/1.23 |
| 5,646,067 | A | 7/1997 | Gaul | 437/180 |
| 5,648,686 | A | 7/1997 | Hirano et al. | 257/778 |
| 5,654,584 | A | 8/1997 | Fujitsu | 257/666 |
| 5,656,858 | A | 8/1997 | Kondo et al. | 257/737 |
| 5,663,598 | A | 9/1997 | Lake et al. | 257/737 |
| 5,665,652 | A | 9/1997 | Shimizu | 438/127 |
| 5,666,008 | A | 9/1997 | Tomita et al. | 257/778 |
| 5,669,545 | A | 9/1997 | Pham et al. | 228/1.1 |
| 5,674,785 | A | 10/1997 | Akram et al. | 437/217 |
| 5,674,787 | A | 10/1997 | Zhao et al. | 437/230 |
| 5,682,061 | A | 10/1997 | Khandros et al. | 257/666 |
| 5,691,041 | A | 11/1997 | Frankeny et al. | 428/209 |
| 5,722,162 | A | 3/1998 | Chou et al. | 29/852 |
| 5,723,369 | A | 3/1998 | Barber | 438/106 |
| 5,731,223 | A | 3/1998 | Padmanabhan | 437/183 |
| 5,736,456 | A | 4/1998 | Akram | 438/614 |
| 5,739,585 | A | 4/1998 | Akram et al. | 257/698 |
| 5,744,859 | A | 4/1998 | Ouchida | 257/668 |
| 5,757,071 | A | 5/1998 | Bhansali | 257/697 |
| 5,757,081 | A | 5/1998 | Chang et al. | 257/778 |
| 5,764,486 | A | 6/1998 | Pendse | 361/774 |
| 5,774,340 | A | 6/1998 | Chang et al. | 361/771 |
| 5,789,271 | A | 8/1998 | Akram | 438/18 |
| 5,798,285 | A | 8/1998 | Bentlage et al. | 438/108 |
| 5,801,072 | A | 9/1998 | Barber | 438/107 |
| 5,801,447 | A | 9/1998 | Hirano et al. | 257/778 |
| 5,803,340 | A | 9/1998 | Yeh et al. | 228/56.3 |
| 5,804,771 | A | 9/1998 | McMahon et al. | 174/255 |
| 5,808,360 | A | 9/1998 | Akram | 257/738 |
| 5,811,879 | A | 9/1998 | Akram | 257/723 |
| 5,817,541 | A | 10/1998 | Averkiou et al. | 438/107 |
| 5,822,856 | A | 10/1998 | Bhatt et al. | 29/832 |
| 5,834,844 | A | 11/1998 | Akagawa et al. | 257/734 |
| 5,861,666 | A | 1/1999 | Bellaar | 257/686 |
| 5,863,816 | A | 1/1999 | Cho | 438/123 |
| 5,870,289 | A | 2/1999 | Tokuda et al. | 361/779 |
| 5,883,435 | A | 3/1999 | Geffken et al. | 257/758 |
| 5,925,931 | A | 7/1999 | Yamamoto | 257/737 |
| 5,994,222 | A | 11/1999 | Smith et al. | 438/689 |
| 6,012,224 | A | 1/2000 | DiStefano et al. | 29/840 |
| 6,013,877 | A | 1/2000 | Degani et al. | 174/264 |
| 6,018,196 | A | 1/2000 | Noddin | 257/777 |
| 6,020,561 | A | 2/2000 | Ishida et al. | 174/261 |
| 6,037,665 | A | 3/2000 | Miyazaki | 257/773 |
| 6,046,909 | A | 4/2000 | Joy | 361/748 |
| 6,084,297 | A | 6/2000 | Brooks et al. | 257/698 |
| 6,084,781 | A | 7/2000 | Klein | 361/771 |
| 6,087,597 | A | 7/2000 | Shimada et al. | 174/263 |
| 6,103,552 | A | 8/2000 | Lin | 438/113 |
| 6,103,992 | A | 8/2000 | Noddin | 219/121.71 |
| 6,127,204 | A | 10/2000 | Isaacs et al. | 438/106 |
| 6,319,751 | B1 * | 11/2001 | Lin | 438/108 |

\* cited by examiner

FLIP CHIP ASSEMBLY WITH VIA INTERCONNECTION

CROSS-REFERENCE TO RELATED APPLICATIONS

The present application is a divisional of U.S. application Ser. No. 09/120,408 filed on Jul. 22, 1998, which claims priority to Singapore application Ser. No. 9800994-7 filed on May 2, 1998.

BACKGROUND OF THE INVENTION

1. Field of the Invention

This invention relates generally to integrated circuit assemblies, and in particular, to the electrical connection of integrated circuits to substrate circuitry, printed circuit board, and interconnect components. Most specifically, the invention relates to a flip chip assembly which includes a single or multi-layered substrate in which via holes are electrically and mechanically connected to the input/output terminal pads of the integrated circuit through direct metallization.

2. Related Art

Recent developments of semiconductor packaging suggest an increasingly critical role of the technology. New demands are coming from requirements for more leads per chip and hence smaller input/output terminal pad pitch, shrinking die and package footprints, and higher operational frequencies that generate more heat, thus requiring advanced heat dissipation designs. In addition to these demands, the more stringent electrical requirements must not be compromised by the packaging. All of these considerations must be met and, as usual, placed in addition to the cost that packaging adds to the semiconductor-manufacturing food chain.

Conventionally, there are three predominant chip-level connection technologies in use for integrated circuits, namely wire bonding, tape automated bonding (TAB) and flip chip (FC) to electrically or mechanically connect integrated circuits to leadframe or substrate circuitry. Wire bonding has been by far the most broadly applied technique in the semiconductor industry because of its maturity and cost effectiveness. However, this process can be performed only one wire bond at a time between the semiconductor chip's bonding pads and the appropriate interconnect points. Furthermore, because of the ever increasing operational frequency of the device, the length of the interconnects needs to be shorter to minimize inductive noise in power and ground, and also to minimize cross-talk between the signal leads. An example of such a method is disclosed in U.S. Pat. No. 5,397,921 to Karnezos.

Flip chip technology involves mounting of an unpackaged semiconductor chip with the active side facing down to an interconnect substrate through contact anchors such as solder, gold or organic conductive adhesive bumps. The major advantage of flip chip technology is the short interconnects which, therefore, can handle high speed or high frequency signals. There are essentially no parasitic elements such as inductance. Not only is the signal propagation delay slashed, but much of the waveform distortion is also eliminated. Flip chip also allows an area array interconnecting layout that provides more I/O than a perimeter interconnect with the same die size. Furthermore, it requires minimal mounting area and weight which results in overall cost saving since no extra packaging and less circuit board space is used. An example of such a method is disclosed in U.S. Pat. No. 5,261,593 to Casson et al.

FIG. 1 is a schematic cross-sectional view of a prior art flip chip assembly in which an integrated circuit chip 101 is attached to a substrate 102 through electrically conductive bumps 103. These bumps 103 make electrical connection between bond pads 104 formed on the chip 101 and conductive traces 105 formed on the surface of the substrate 102. These traces 105 further extend to the other side of the substrate 102 through via holes 107 that are formed within the substrate 102. In the dielectric substrate, a via hole connects two or multiple layers of circuitry in a substrate. A via hole links both sides of the finished substrate, whereas a blind via links one side to one or multiple internal layers and a buried via links internal layers without being visible on the surface of the board. These via holes are typically metallized on the sidewall with copper by electroless plating and electroplating. Underfilled material 106 is typically applied between integrated circuit chip 101 and substrate 102 in order to reduce the stress due to thermal characteristic mismatch of the chip 101 and substrate 102. Conductive traces 105 formed on the top of the substrate 102 extend from the via holes to specific contacting pads or balls 108 and therefore connect to the external circuitry.

While flip chip technology has tremendous advantages over wire bonding, its cost and technical limitations are significant. First of all, flip chip technology must confront the challenge of forming protruded contact anchors or bumps to serve as electrical connections between the integrated circuit chip and substrate circuitry. A variety of bumping processes have therefore been developed. These include vacuum deposition of an intermediate underbump layer which serves as an adhesive and diffusion barrier. This barrier layer is composed of a film stack which can be in the structure of chromium/copper/gold. Bumping materials such as solder are subsequently deposited onto this intermediate layer through evaporation, sputtering, electroplating, solder jetting or paste printing methods followed by a reflow step to form the solder contacts.

Techniques for fabricating the intermediate under-bump barrier layer as well as the bump material utilizing electroless plating are also known. In these attempts, as shown in FIG. 2, the input/output terminal pads 201 of the integrated circuit chip 200 are firstly activated by a catalytic solution which will selectively activate the pad material through chemical reactions and form a thin layer of catalyst 202. This thin layer of catalyst 202 is typically composed of zinc or palladium. When electroless plating is executed thereafter, material such as nickel, gold, palladium or their alloys can be selectively initiated and continuously deposited on the pads to form the bumps 203. In the above-described electroless plating process, hypophosphate or boron hydride are commonly used as the reducing agent in the nickel plating solution. This electroless plated bump not only provides the protruding contact anchor but also serves as the diffusion barrier and provides sealing. Contacting material such as solder, conductive adhesive or polymer is subsequently applied onto these bumps by techniques such as solder dipping, solder jetting, evaporation, screen printing or dispensing. An example of such a method is described in the U.S. Pat. No. 5,583,073 to Lin et al.

Although the electroless technique provides an economical, simple and effective method for fabricating the under bump barrier layer, contacting material such as solder or adhesive is still required for assembling. Solder dipping or screen printing of solder paste onto these bumps has been explored but with very limited success due to solder bridging and non-uniform deposition of solder on the metal bumps. This process also suffers from poor process control as the input/output terminal pad spacing gets smaller. Additional problems have been encountered with tin/lead solder due to its increase in electrical resistance over time. Moreover, the solder contacts are easily fatigued by thermo-mechanical stressing.

Organic contacts which utilize conductive adhesive to replace solder joints are described in U.S. Pat. No. 5,627,405 to Chillara. Generally speaking, the conductive adhesive, which is made by adding conductive fillers to polymer binders, holds a number of technical advantages over soldering such as environmental compatibility, lower-temperature processing capability, fine pitch and simplified processes. However, conductive adhesive does not normally form a metallurgical interface in the classical sense. The basic electrical pathway is through conductive particles of the adhesive that are in contact with one another and reach out to the two contact surfaces of the components. Under certain environments, this interconnect system may cause problems because the penetration of moisture through the polymer may induce corrosion and oxidation of the conducting metal particles which results in unstable electrical contacts. Furthermore, failure of the joints can also occur due to degradation of the polymer matrix as well as degradation of the metal parts. Since the electrical and mechanical performance are independent of each other, good mechanical performance is no assurance of electrical integrity.

In view of the limitations in the currently available integrated circuit assembling methods, a high-performance, reliable and economical method which interconnects integrated circuits to the external circuitry would be greatly desirable.

SUMMARY OF THE INVENTION

According to the invention, a flip chip assembly is provided to address high density, low cost and high performance requirements of electronics products. It involves the direct interconnection of an integrated circuit chip to substrate circuitry through direct metallization of via holes and bond pads without the need for bumps, wire bonds, or other media.

To achieve the foregoing and in accordance with the invention, the assembly includes a rigid or flexible dielectric substrate having a plurality of electrically conductive circuitry traces, one or more integrated circuit chips having a plurality of input/output terminal pads, and a plurality of via holes formed in the dielectric substrate for electrically connecting respective traces of the substrate with respective pads of the integrated circuit chip. Preferably, a metallic film is formed on the sidewalls of the via holes. The metallic film may include copper, nickel, palladium or gold. The surface of the integrated circuit chip and the dielectric substrate may be arranged in substantially mutually parallel planes. The orientation of the contact is in such a manner that the via holes in the dielectric substrate are aligned with the top of the pads of the integrated circuit chip so that these pads can be totally or partially exposed through the opposite side of the substrate. After the alignment, the connecting step may include attaching the integrated circuit chip to the dielectric substrate through mechanical or chemical techniques to form an assembly. The attachment may be provided by an adhesive film, a liquid adhesive or mechanical clamping. Electrically conductive material is subsequently deposited in the via holes as well as on the surface of the input/output terminal pads of the integrated circuit chip to provide electrical and mechanical connections between the terminal pads and the traces of the dielectric circuitry. After the via holes are connected to the terminal pads, the mechanical and chemical means that provided the chip and substrate attachment can be removed or left as an integral part of the assembly since the via hole connections also provide mechanical support.

In a method aspect of the invention, the connection is provided by electroless plating. The electroless plating initiates and continuously deposits electrically conductive material such as copper, nickel, palladium, gold and their alloys on the via hole sidewalls as well as input/output terminal pads of the integrated chip. As the plating process continues, the metallic surface of the via hole sidewalls and terminal pads will extend out and contact each other and finally join together and become an integrated part. These simultaneously electrolessly plated joints provide effective electrical and mechanical connections between the integrated circuit chip and the dielectric circuitry.

In another method aspect of the invention, the connection may take the form of electrochemical plating. In this method, metallized via holes in the dielectric substrate are electrically connected to an external power source and serve as one electrode for plating. This plating process can be carried out on the sidewalls of via holes as well as other areas that receive electricity from the power source and are exposed to the electrochemical plating solution. In the initial stage, the terminal pads of the integrated circuit chip do not receive electroplating due to lack of electrical contact with the power source. However, as the via hole sidewall plating process continues, the metallizing surface will extend out and finally contact and provide electricity to the terminal pads and subsequently initiate electroplating on them. These simultaneously electroplated parts join together and provide effective electrical and mechanical connections between the chip and the dielectric circuitry.

According to a further aspect of the invention, the connection may take the form of solder paste, liquid solder, solder particles, epoxy or conductive polymer which is reflowable and bondable to the integrated circuit chip terminal pads and via hole walls after the application of heat or an energy source such as a laser or infrared light. In this method, the filling material can be filled into the via holes through selective printing, jetting or ball placement techniques. As the external energy such as heat or a laser is applied to the filling material, the original form of the material will melt and change its shape, enlarge the contacting areas, and adhere to the wettable surfaces thus providing effective electrical and mechanical contacts between pre-metallized via hole sidewalls and input/output terminal pads of the integrated circuit chip. In some embodiments, these input/output terminal pads are pre-treated or coated with a thin protective layer if the material is vulnerable to corrosion or dissolution through reactions by the joint material such as solder.

According to the invention, via holes of the substrate can be formed by various techniques including mechanical drilling, mechanical punching, plasma etching or laser drilling. They are formed in the substrate at locations where electrical circuitry on one side of the substrate can be connected to the opposite side of the surface on which the semiconductor chip or chips are mounted and their input/output terminal pads can be exposed through these holes.

According to the invention, dielectric layers of the rigid substrate can be either organic or inorganic material. An organic substrate is preferable for lower cost and superior dielectric property whereas an inorganic substrate is preferable when high thermal dissipation and matched coefficient of expansion are desired. Suitable dielectrics include plastics, ceramics and flexible films.

If the finished product is, for instance, a ball grid array, solder balls can be formed on the traces. This finished package can be connected to a printed circuit board by reflowing the solder balls to form an attachment to the conductors on the surface of the printed circuit board.

In summary, using via hole direct connection of an integrated circuit chip and dielectric substrate circuitry instead of anchoring solder or a conductive adhesive bump allows a high reliability, low profile, and high performance assembly to be achieved. In particular, a small via hole formed by laser drilling or other techniques allows a very fine pitch terminal pad to be interconnected, which can significantly enhance the capability of packaging future high I/O semiconductor chips.

DETAILED DESCRIPTION OF THE INVENTION

The present invention will be illustrated further by the following examples. These examples are meant to illustrate and not to limit the invention, the scope of which is defined solely by the appended claims.

EXAMPLE 1

Figure 1:
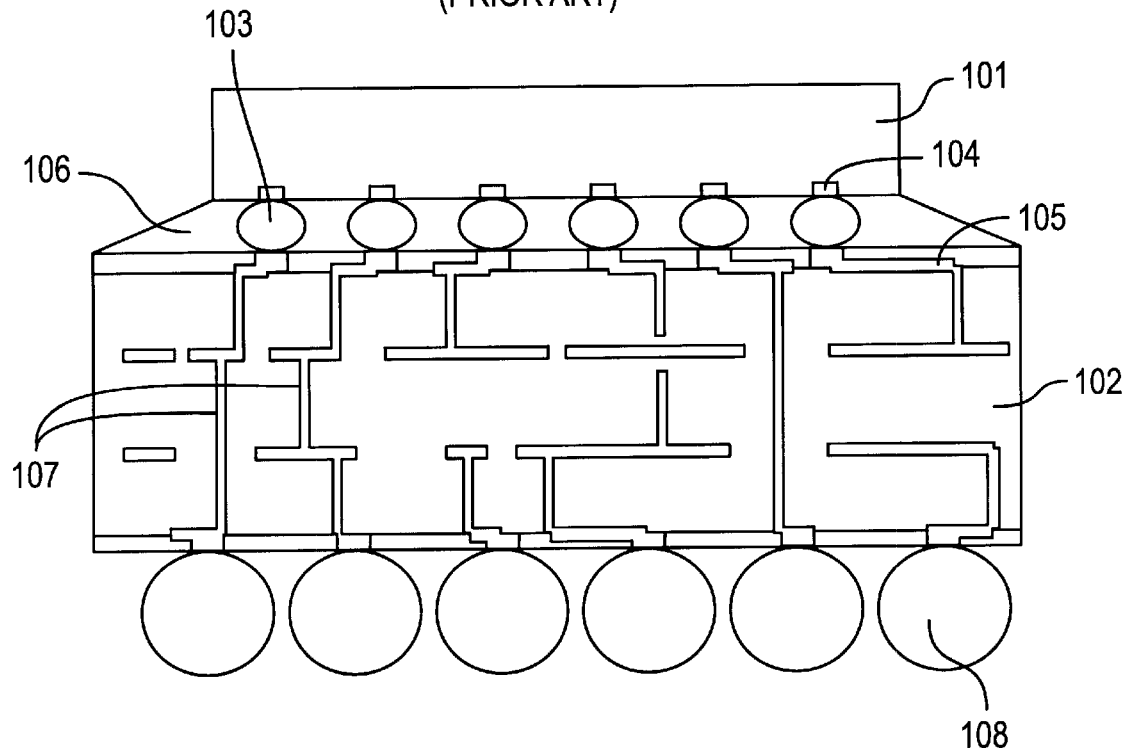
FIG. 1 (prior art) is a diagrammatic cross-sectional view of a conventional flip chip package with solder bumps.
Figure 2:
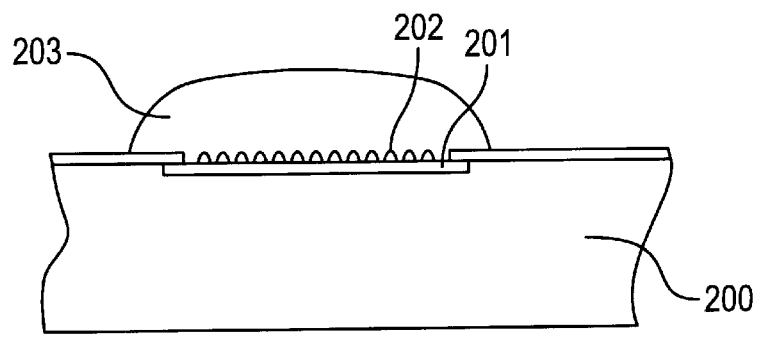
FIG. 2 (prior art) is a diagrammatic cross-sectional view of a conventional electroless plated nickel bump structure.
Figure 3A:
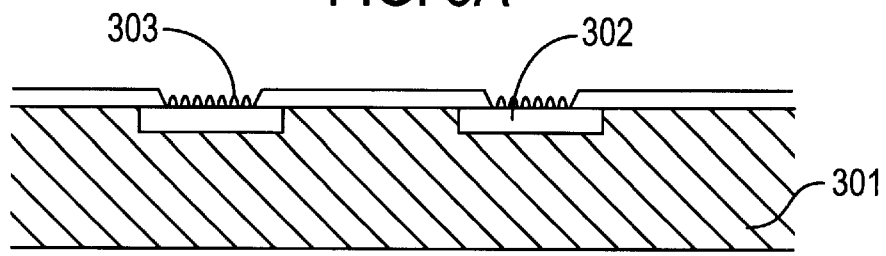
FIGS. 3A to 3D are diagrammatic cross-sectional views showing the steps involved in the manufacturing of an integrated circuit assembly by electroless plating according to an embodiment of the invention.

FIGS. 3A through 3D illustrate a process for producing an embodiment of the flip chip assembly according to the present invention. Referring initially to FIG. 3A, an integrated circuit chip 301 in which various types of transistors, wiring and the like are formed (not shown) has a plurality of exposed input/output terminal pads 302. These pads 302 are firstly cleaned by dipping the integrated circuit chip 301 in a phosphoric acid solution at room temperature with an immersion time of 10 minutes to remove the surface oxide film. This chip is next dipped in a diluted catalytic solution Enthone "Alumon EN" (trademark) at 25 degrees C. for 20 seconds to form a thin zinc film 303 on the surface of the aluminum alloy terminals 302, followed by a thorough distilled water rinse to ensure there is no residue left on the surface of integrated circuit chip 301.

Figure 3B:
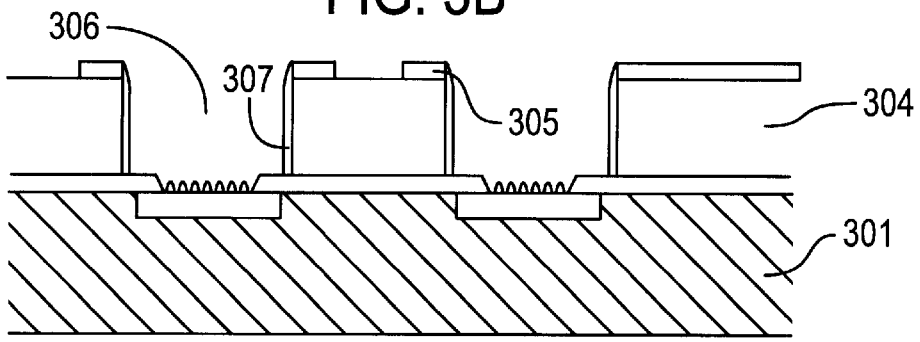

FIG. 3B shows a double-sided or multi-layer dielectric substrate 304 having a plurality of electrically conductive circuitry traces 305 attached to the integrated circuit chip. The traces 305 on one surface of the substrate 304 extend to a plurality of via holes 306 of the dielectric substrate 304. The metallic film 307 on the sidewall of the via holes is formed by conventional techniques including electroless plating, sputtering or evaporation or a combination of these techniques. These holes 306 are arranged in such a manner that the terminal pads 302 of the integrated circuit chip 301 can be totally or partially exposed when integrated circuit chip 301 is mounted on the substrate 304. These holes 306 serve as electrically connecting channels for respective traces 305 on the top surface of the substrate 304 with respective terminal pads 302 of the integrated circuit chip 301. The metallic film on the sidewalls of via holes 306 is activated by immersing in a palladium chloride solution (0.05 M) for readily initiating electroless plating.

Figure 3C:
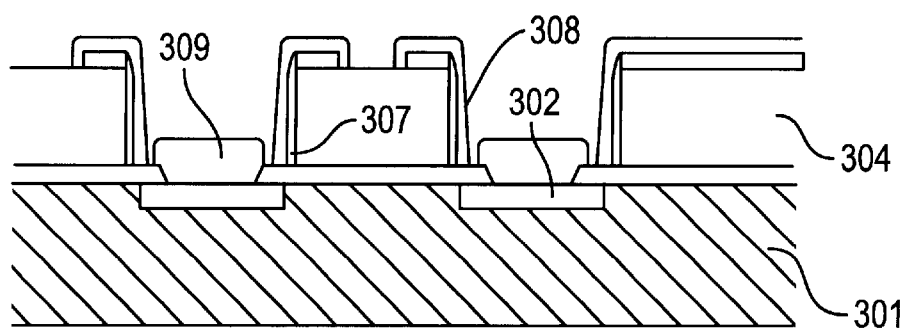

Now referring to FIG. 3C, after chip 301 is securely attached to the substrate 304, the chip assembly is immersed in the electroless plating solution Shipley "NIPOSIT 468" (trademark) at 65 degrees C. The electroless plating initiates and continuously deposits a thin layer of nickel film 308 containing phosphorus (to be referred to as a nickel film hereafter) on the pre-activated metal film 307 and nickel film 309 on the input/output terminal pads 302 of the integrated circuit chip 301.

Figure 3D:
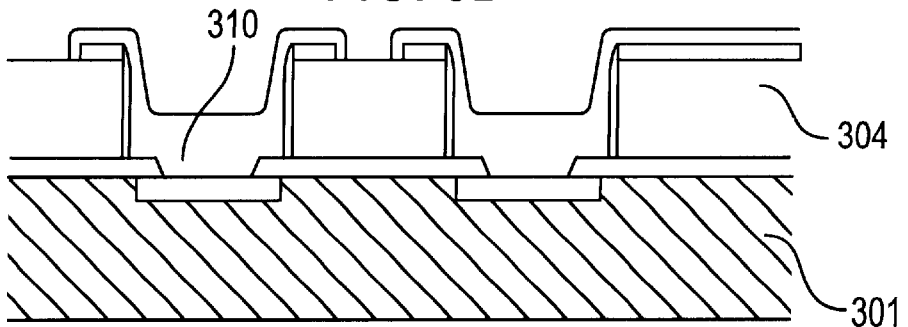

FIG. 3D shows the metallic surface of the via hole sidewalls and input/output terminal pads finally contact and join together to become an integrated part 310 as the plating process continues. These simultaneously plated joints 310 provide effective electrical and mechanical connections between the input/output terminal pads and the traces of the dielectric circuitry.

Though only one integrated circuit chip 301 is shown, it is to be understood that additional integrated circuit chips, as well as passive components such as resistors or capacitors, can also be mounted on substrate 304.

EXAMPLE 2

Figure 4A:
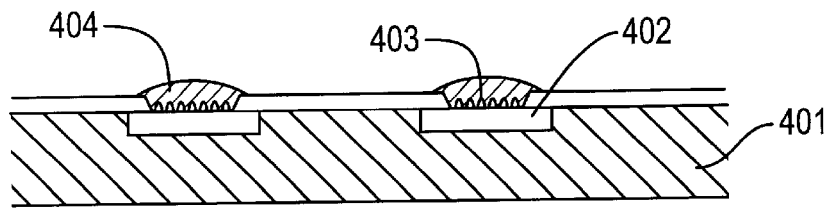
FIGS. 4A to 4E are diagrammatic cross-sectional views showing the steps involved in the manufacturing of an integrated circuit assembly by electroless via fill according to another embodiment of the invention.

FIGS. 4A through 4E illustrate a process for producing another embodiment of the flip chip assembly according to the present invention. Referring now to FIG. 4A, an integrated circuit chip 401 similar to that in example 1 is cleaned in an alkaline solution containing 0.02 M sodium hydroxide at room temperature (25 degrees C) with an immersion time of 1 minute. This chip 401 is next dipped in a catalytic solution Shipley "DURAPREP 40" (trademark) at 25 degrees C. with an immersion time of 2 minutes to form an activation layer 403 on the surface of the terminal pads 402. After a thorough rinse in distilled water, the integrated circuit chip is immersed in a Shipley "NIPOSIT 468" (trademark) electroless plating bath for 2 minutes, at 65 degrees C. A thin layer of nickel film 404 containing phosphorus (to be referred to as a nickel film hereafter) precipitates on and around the terminal pads 402.

Figure 4B:
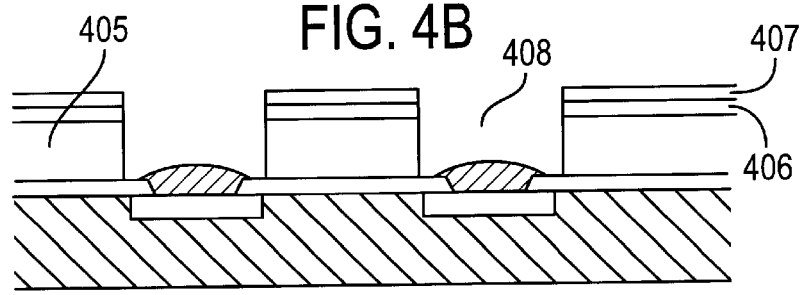

FIG. 4B shows a dielectric substrate 405 having a sheet of copper 406 on the top of the surface and covered by a layer of insulating film 407. A plurality of via holes 408 are drilled and arranged in such a manner that the input/output terminal pads 402 of the integrated circuit chip 401 can be totally or partially exposed when integrated circuit chip 401 is mounted on the substrate 405. There is no activation layer or metallized film on the via hole sidewalls.

Figure 4C:
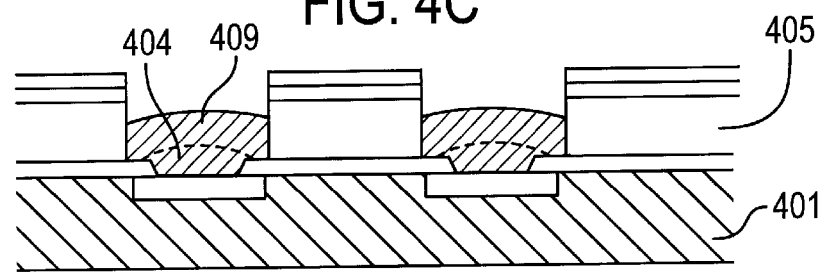

FIG. 4C shows the integrated circuit chip 401 securely attached to the substrate 405, the integrated circuit chip assembly is then immersed in the electroless plating solution Shipley "NIPOSIT 468" (trademark) at 65 degrees C. The electroless plating initiates and continuously deposits nickel pillar 409 on the top of the pre-deposited nickel film 404 (shown in phantom lines) of the integrated circuit chip 401.

Figure 4D:
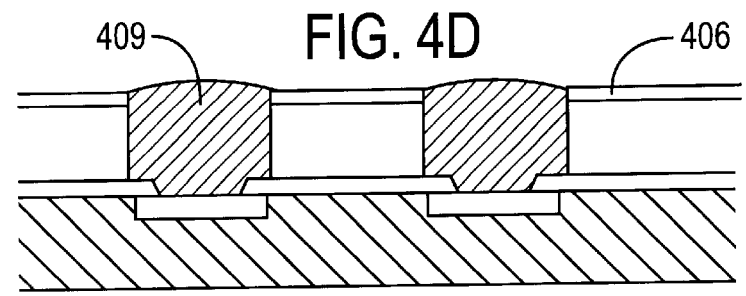

FIG. 4D shows that the plated nickel 409 has reached the dielectric edge of the hole 408 and contacts the top layer of copper sheet 406. The insulating film 407 is stripped off after the nickel via-fill reaches the copper sheet. These plated joints provide effective electrical and mechanical connections between the input/output terminal pads and the top surface of the dielectric circuitry.

Figure 4E:
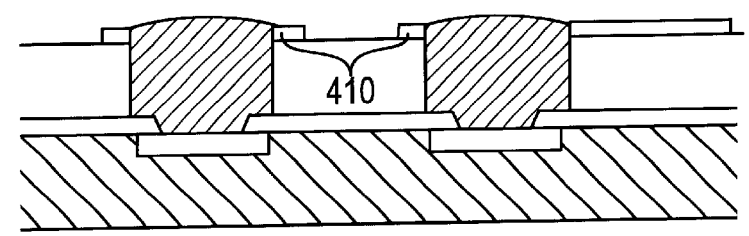

FIG. 4E shows a plurality of copper circuitry traces 410 formed on the surface of the substrate by conventional etching techniques. These traces 410 extend from a plurality of electroless nickel-filled holes 408 of the dielectric substrate 405 and serve as electrically connecting channels with respective input/output terminal pads 402 to the external circuitry.

EXAMPLE 3

Figure 5A:
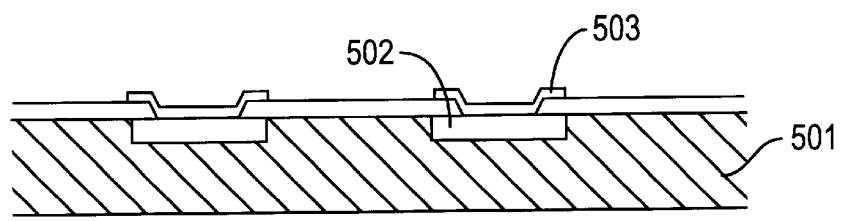
FIGS. 5A to 5E are diagrammatic cross-sectional views showing the steps involved in the manufacturing of an integrated circuit assembly by electroplating according to another embodiment of the invention.

FIGS. 5A through 5E illustrate a process for producing another embodiment of the flip chip assembly according to the present invention. Referring now to FIG. 5A, an integrated circuit chip 501 similar to that in example 1 is cleaned in an alkaline solution containing 0.05 M phosphoric acid at room temperature (25 degrees C) with immersion time of 1 minute. The chip is then thoroughly rinsed in distilled water to ensure there is no residue left on the surface of integrated circuit chip. A multi-layered thin film 503 having the structure of chromium (500 A)/copper (700 A)/gold (1000 A), respectively, is selectively deposited on the terminal pads 502 to serve as a barrier and adhesive layer.

Figure 5B:
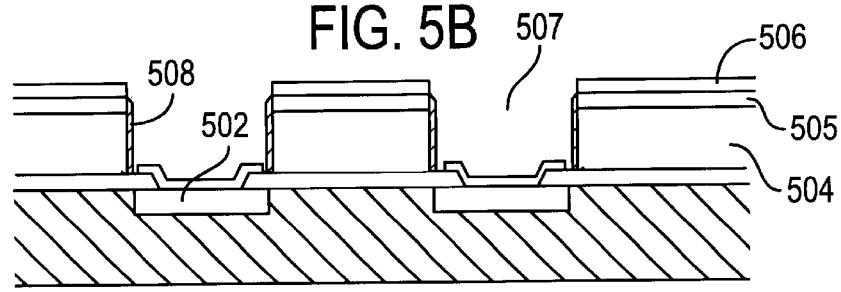

FIG. 5B shows a dielectric substrate 504 having a sheet of copper 505 on the top of the surface and covered by a layer of insulating film 506. A plurality of via holes 507 having a thin copper film 508 on the sidewalls is arranged in such a manner that the input/output terminal pads 502 of the integrated circuit chip 501 can be totally or partially exposed when it is mounted on the substrate 504.

Figure 5C:
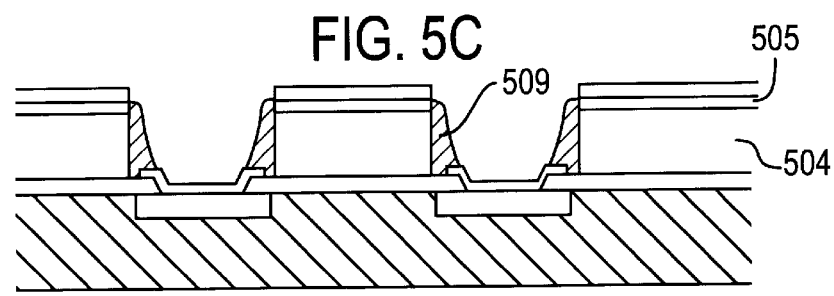

FIG. 5C show the assembly immersed in the copper plating solution Sel-Rex "CUBATH M" (trademark) at 25 degrees C. An electric power source is connected to the copper 505 on the top surface of the dielectric substrate. The electroplating reaction initiates and continuously deposits copper 509 on the sidewalls of the via holes. As the plating process proceeds, the sidewall copper 509 continually grows.

Figure 5D:
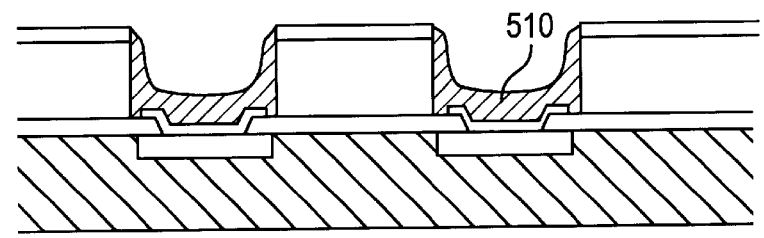

FIG. 5D shows the plated copper forming on the gold surface of the thin film 503 of the terminal pads to provide electrical contacts to the terminal pads and initiate plating copper thereon. These electroplated joints 510 provide effective electrical and mechanical connections between the input/output terminal pads and the top surface of the dielectric circuitry. The insulating layer 506 is stripped off.

Figure 5E:
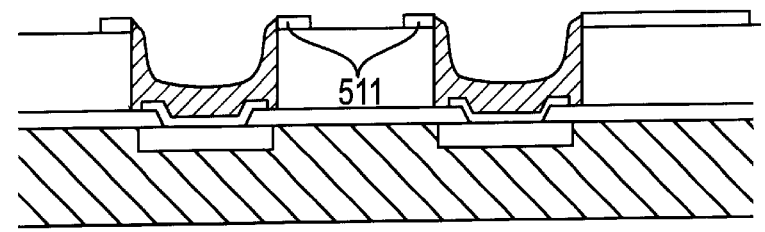

FIG. 5E shows a plurality of copper circuitry traces 511 formed on the surface of the substrate by conventional etching techniques. These traces 511 extend from a plurality of electroplated copper via holes 507 of the dielectric substrate 504 and serve as electrically connecting channels with respective input/output terminal pads 502 to the external circuitry.

EXAMPLE 4

Figure 6A:
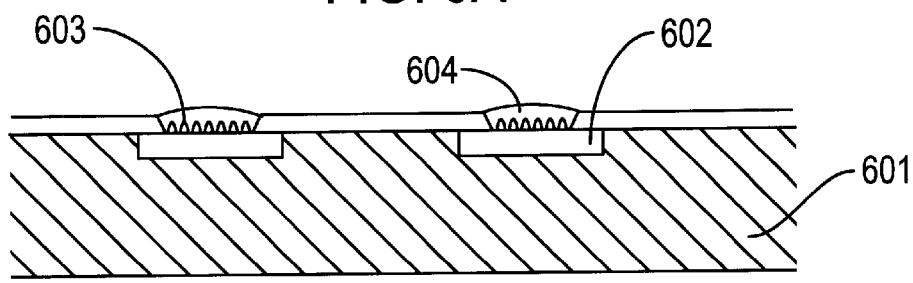
FIGS. 6A to 6D are diagrammatic cross-sectional views showing the steps involved in the manufacturing of an integrated circuit assembly by solder via fill according to another embodiment of the invention.

FIGS. 6A through 6D illustrate a process for producing another embodiment of the flip chip assembly according to the present invention. Referring now to FIG. 6A, an integrated circuit chip 601 similar to that in example 1 has a plurality of input/output terminal pads 602 exposed. These pads 602 are firstly cleaned by dipping the integrated circuit chip 601 in a phosphoric acid solution at room temperature with an immersion time of 10 minutes to remove the surface oxide film. This chip is next dipped in a diluted catalytic solution Enthone "Alumon EN" (trademark) at 25 degrees C. for 20 seconds to form a thin zinc film 603 on the surface of aluminum alloy terminal pads 602 followed by a thorough distilled water rinse to ensure there is no residue left on the surface of integrated circuit chip. The integrated circuit chip is then immersed in a Shipley "NIPOSIT 468" (trademark) electroless plating bath for 2 minutes at 65 degrees C. A thin layer of nickel film 604 containing phosphorus is deposited on and around the terminal pads 602.

Figure 6B:
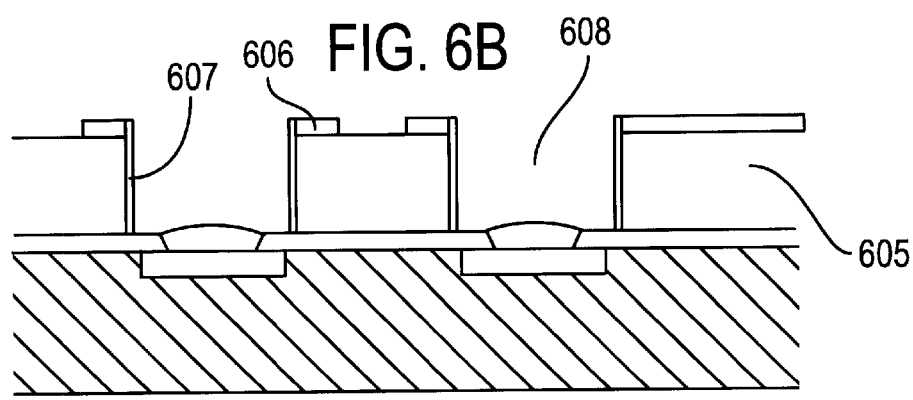

FIG. 6B shows a double-sided or multi-layer dielectric substrate 605 having a plurality of copper circuitry traces 606. The traces 606 on one surface of the substrate extend to a plurality of via holes 608 which are pre-metallized with gold plated copper film 607 on the sidewalls. These holes 608 are arranged in such a manner that the terminal pads 602 of the integrated circuit chip 601 can be totally or partially exposed when integrated circuit chip 601 is mounted on the substrate 605. These holes 608 serve as electrically connecting channels for respective traces 606 on the top surface of the substrate 605 with respective input/output terminal pads 602 of the integrated circuit chip 601.

Figure 6C:
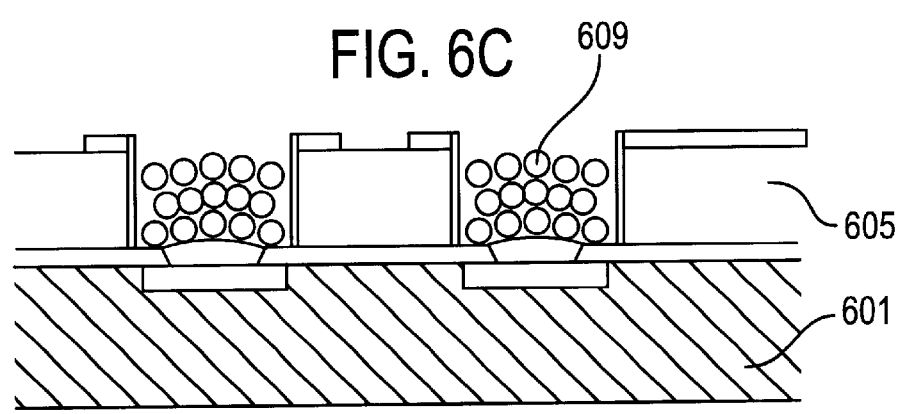

FIG. 6C shows the integrated circuit chip 601 securely attached to the substrate 605. Tin-lead solder balls 609 are placed into these via holes 608 by a conventional ball placement machine. Enough solder balls 609 should be placed to fill the via holes without exceeding the total volume.

Figure 6D:
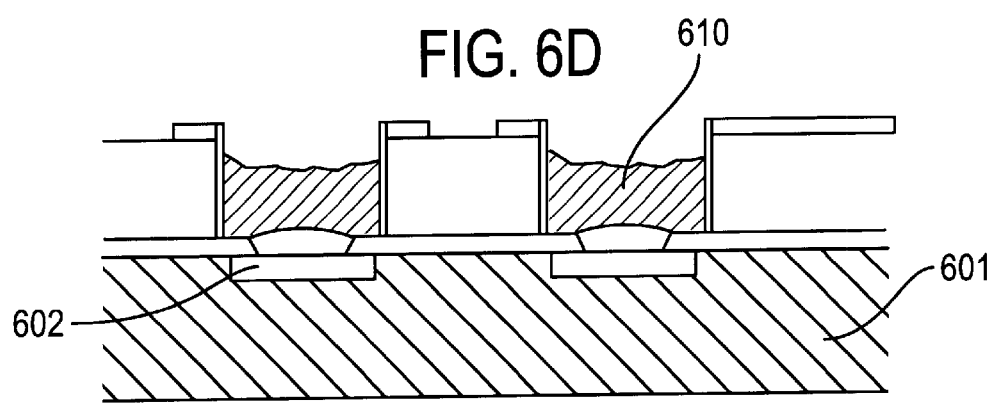

As shown in FIG. 6D, heat is applied to the assembly. When the temperature reaches 350 degrees C. for 1 minute, the solder balls melt and fill the lower part of the via holes. When the heat is removed, solder columns 610 adhere to the sidewalls of the via holes as well as the input/output terminal pads 602 of the integrated circuit chip 601 thus providing effective electrical and mechanical contacts.

I claim:

1. A method of making a flip chip assembly, comprising:
attaching a semiconductor chip to a substrate, wherein the chip includes a terminal pad, the substrate includes a dielectric layer and a metallic film, the dielectric layer includes first and second surfaces that are opposite one another and a via hole that extends between the first and second surfaces, the metallic film is disposed on sidewalls of the via hole and extends along the sidewalls to the first and second surfaces, and the via hole is aligned with and exposes the terminal pad; and then
depositing an electrically conductive material into the via hole and on the metallic film and the terminal pad.

2. The method as recited in claim 1, wherein the terminal pad is directly beneath substantially all surface area defined by the via hole.

3. The method as recited in claim 1, wherein substantially all of the electrically conductive material is within the via hole.

4. The method as recited in claim 1, wherein the metallic film and the electrically conductive material are the only materials in the via hole.

5. The method as recited in claim 1, wherein the electrically conductive material fills a bottom portion of the via hole without filling a top portion of the via hole.

6. The method as recited in claim 1, wherein the electrically conductive material includes electroplated metal.

7. The method as recited in claim 1, wherein the electrically conductive material includes electrolessly plated metal.

8. The method as recited in claim 1, wherein the electrically conductive material includes solder.

9. The method as recited in claim 1, wherein the electrically conductive material includes epoxy.

10. The method as recited in claim 1, wherein the electrically conductive material includes conductive polymer.

11. A method of making a flip chip assembly, comprising the following steps in the sequence set forth:
providing a substrate that includes a dielectric layer, wherein the dielectric layer includes first and second surfaces that are opposite one another and a via hole that extends between the first and second surfaces;
depositing a metallic film on sidewalls of the via hole;
attaching the substrate to a semiconductor chip that includes a terminal pad, wherein the first surface is opposite the chip and the via hole exposes the pad; and
depositing an electrically conductive material into the via hole and on the metallic film and the terminal pad.

12. The method as recited in claim 11, wherein the terminal pad is directly beneath substantially all surface area defined by the via hole.

13. The method as recited in claim 11, wherein substantially all of the electrically conductive material is within the via hole.

14. The method as recited in claim 11, wherein the metallic film and the electrically conductive material are the only materials in the via hole.

15. The method as recited in claim 11, wherein the electrically conductive material fills a bottom portion of the via hole without filling a top portion of the via hole.

16. The method as recited in claim 11, wherein the electrically conductive material includes electroplated metal.

17. The method as recited in claim 11, wherein the electrically conductive material includes electrolessly plated metal.

18. The method as recited in claim 11, wherein the electrically conductive material includes solder.

19. The method as recited in claim 11, wherein the electrically conductive material includes epoxy.

20. The method as recited in claim 11, wherein the electrically conductive material includes conductive polymer.

21. A method of making a flip chip assembly, comprising the following steps in the sequence set forth:
providing a substrate including a dielectric layer and an electrically conductive trace, wherein the dielectric layer includes first and second surfaces that are opposite one another and a via hole that extends between the first and second surfaces, and the conductive trace is disposed on the first surface;
depositing a metallic film on sidewalls of the via hole, wherein the metallic film extends along the sidewalls to the first and second surfaces and contacts and is electrically connected to the conductive trace;
positioning the substrate relative to a semiconductor chip, wherein the chip includes a terminal pad, the first surface faces away from the chip, the second surface faces towards the chip, and the via hole exposes the terminal pad; and
electrolessly plating a metal in the via hole and on the metallic film and the terminal pad, wherein the metal electrically connects the metallic film and the terminal pad.

22. The method as recited in claim 21, wherein depositing the metallic film includes electrolessly plating the metallic film.

23. The method as recited in claim 21, wherein depositing the metallic film includes sputtering the metallic film.

24. The method as recited in claim 21, wherein depositing the metallic film includes evaporating the metallic film.

25. The method as recited in claim 21, wherein positioning the substrate relative to the chip includes attaching the substrate to the chip using an adhesive.

26. The method as recited in claim 21, wherein positioning the substrate relative to the chip includes attaching the substrate to the chip using a mechanical clamp.

27. The method as recited in claim 21, including activating the metallic film for initiating electroless plating before positioning the substrate relative to the chip.

28. The method as recited in claim 21, including activating the terminal pad for initiating electroless plating before positioning the substrate relative to the chip.

29. The method as recited in claim 21, including activating the metallic film for initiating electroless plating using a solution containing palladium before positioning the substrate relative to the chip, and activating the terminal pad for initiating electroless plating using a solution containing zinc before positioning the substrate relative to the chip.

30. The method as recited in claim 21, wherein electrolessly plating the metal includes initially electrolessly plating a first portion of the metal on the metallic film and a second portion of the metal on the terminal pad such that the first and second portions of the metal do not contact one another, thereby electrically isolating the metallic film and the terminal pad, and then electrolessly plating the first portion of the metal on the metallic film and the second portion of the metal on the terminal pad such that the first and second portions of the metal contact one another, thereby electrically connecting the metallic film and the terminal pad.

31. A method of making a flip chip assembly, comprising the following steps in the sequence set forth:
providing a substrate, including providing a dielectric layer that includes first and second surfaces that are opposite one another, forming a via hole in the dielectric layer that extends between the first and second surfaces, and forming a conductive trace on the first surface;
depositing a metallic film on sidewalls of the via hole, wherein the metallic film extends along the sidewalls to the first and second surfaces and contacts and is electrically connected to the conductive trace;
attaching the substrate to a semiconductor chip, wherein the chip includes a terminal pad, the first surface faces away from the chip, the second surface faces towards the chip, and the via hole is aligned with and exposes the terminal pad; and
electrolessly plating a metal on the metallic film and the terminal pad, thereby providing a plated joint that electrically connects the metallic film and the terminal pad.

32. The method as recited in claim 31, wherein the dielectric layer is plastic.

33. The method as recited in claim 31, wherein the dielectric layer is ceramic.

34. The method as recited in claim 31, wherein the dielectric layer is a flexible film.

35. The method as recited in claim 31, wherein forming the via hole includes drilling the dielectric layer.

36. The method as recited in claim 31, wherein forming the via hole includes etching the dielectric layer.

37. The method as recited in claim 31, wherein forming the via hole includes punching the dielectric layer.

38. The method as recited in claim 31, wherein depositing the metallic film includes electrolessly plating the metallic film.

39. The method as recited in claim 31, wherein depositing the metallic film includes sputtering the metallic film.

40. The method as recited in claim 31, wherein depositing the metallic film includes evaporating the metallic film.

41. The method as recited in claim 31, wherein attaching the substrate to the chip includes disposing an adhesive between and in contact with the dielectric layer and the chip.

42. The method as recited in claim 31, wherein attaching the substrate to the chip includes using a mechanical clamp.

43. The method as recited in claim 31, wherein attaching the substrate to the chip positions the via hole relative to the terminal pad such that terminal pad is directly beneath substantially all surface area defined by the via hole.

44. The method as recited in claim 31, wherein attaching the substrate to the chip positions the via hole relative to the terminal pad such that the via hole exposes the terminal pad without exposing any other terminal pad on the chip.

45. The method as recited in claim 31, wherein attaching the substrate to the chip positions the metallic film relative to the terminal pad such that the metallic film is spaced from and electrically isolated from the terminal pad.

46. The method as recited in claim 31, wherein substantially all of the metal is within the via hole.

47. The method as recited in claim 31, wherein the metal and the metallic film are the only materials in the via hole.

48. The method as recited in claim 31, wherein the metal fills a bottom portion of the via hole without filling a top portion of the via hole.

49. The method as recited in claim 31, wherein the metal has a bowl-like shape.

50. The method as recited in claim 31, wherein electrolessly plating the metal includes initially electrolessly plating a first portion of the metal on the metallic film and a second portion of the metal on the terminal pad such that the first and second portions of the metal do not contact one another, thereby electrically isolating the metallic film and the terminal pad, and then electrolessly plating the first portion of the metal on the metallic film and the second portion of the metal on the terminal pad such that the first and second portions of the metal contact one another, thereby electrically connecting the metallic film and the terminal pad.

51. A method of making a flip chip assembly, comprising the following steps in the sequence set forth:
providing a substrate including a dielectric layer and an electrically conductive trace, wherein the dielectric layer includes first and second surfaces that are opposite one another and a via hole that extends between the first and second surfaces, and the conductive trace is disposed on the first surface;
depositing a metallic film on sidewalls of the via hole, wherein the metallic film extends along the sidewalls to the first and second surfaces and contacts and is electrically connected to the conductive trace;
positioning the substrate relative to a semiconductor chip, wherein the chip includes a terminal pad, the first surface faces away from the chip, the second surface faces towards the chip, and the via hole exposes the terminal pad; and
electroplating a metal in the via hole and on the metallic film and the terminal pad, wherein the metal electrically connects the metallic film and the terminal pad.

52. The method as recited in claim 51, wherein depositing the metallic film includes electrolessly plating the metallic film.

53. The method as recited in claim 51, wherein depositing the metallic film includes sputtering the metallic film.

54. The method as recited in claim 51, wherein depositing the metallic film includes evaporating the metallic film.

55. The method as recited in claim 51, wherein positioning the substrate relative to the chip includes attaching the substrate to the chip using an adhesive.

56. The method as recited in claim 51, wherein positioning the substrate relative to the chip includes attaching the substrate to the chip using a mechanical clamp.

57. The method as recited in claim 51, wherein positioning the substrate relative to the chip positions the via hole relative to the terminal pad such that terminal pad is directly beneath substantially all surface area defined by the via hole.

58. The method as recited in claim 51, wherein positioning the substrate to the chip positions the via hole relative to the terminal pad such that the via hole exposes the terminal pad without exposing any other terminal pad on the chip.

59. The method as recited in claim 51, wherein positioning the substrate to the chip positions the metallic film relative to the terminal pad such that the metallic film is spaced from and electrically isolated from the terminal pad.

60. The method as recited in claim 51, wherein electroplating the metal includes initially electroplating the metal on the metallic film without electroplating the metal on the terminal pad, thereby electrically isolating the metallic film and the terminal pad, and then electroplating the metal on the metallic film and the terminal pad after the metal on the metallic film contacts the terminal pad, thereby electrically connecting the metallic film and the terminal pad.

61. A method of making a flip chip assembly, comprising the following steps in the sequence set forth:
providing a substrate, including providing a dielectric layer that includes first and second surfaces that are opposite one another, forming a via hole in the dielectric layer that extends between the first and second surfaces, and forming a conductive trace on the first surface;
depositing a metallic film on sidewalls of the via hole, wherein the metallic film extends along the sidewalls to the first and second surfaces and contacts and is electrically connected to the conductive trace;
attaching the substrate to a semiconductor chip, wherein the chip includes a terminal pad, the first surface faces away from the chip, the second surface faces towards the chip, and the via hole is aligned with and exposes the terminal pad; and
electroplating a metal on the metallic film and the terminal pad, thereby providing a plated joint that electrically connects the metallic film and the terminal pad.

62. The method as recited in claim 61, wherein the dielectric layer is plastic.

63. The method as recited in claim 61, wherein the dielectric layer is ceramic.

64. The method as recited in claim 61, wherein the dielectric layer is a flexible film.

65. The method as recited in claim 61, wherein forming the via hole includes drilling the dielectric layer.

66. The method as recited in claim 61, wherein forming the via hole includes etching the dielectric layer.

67. The method as recited in claim 61, wherein forming the via hole includes punching the dielectric layer.

68. The method as recited in claim 61, wherein depositing the metallic film includes electrolessly plating the metallic film.

69. The method as recited in claim 61, wherein depositing the metallic film includes sputtering the metallic film.

70. The method as recited in claim 61, wherein depositing the metallic film includes evaporating the metallic film.

71. The method as recited in claim 61, wherein attaching the substrate to the chip includes disposing an adhesive between and in contact with the dielectric layer and the chip.

72. The method as recited in claim 61, wherein attaching the substrate to the chip includes using a mechanical clamp.

73. The method as recited in claim 61, wherein attaching the substrate to the chip positions the via hole relative to the terminal pad such that terminal pad is directly beneath substantially all surface area defined by the via hole.

74. The method as recited in claim 61, wherein attaching the substrate to the chip positions the via hole relative to the terminal pad such that the via hole exposes the terminal pad without exposing any other terminal pad on the chip.

75. The method as recited in claim 61, wherein attaching the substrate to the chip positions the metallic film relative to the terminal pad such that the metallic film is spaced from and electrically isolated from the terminal pad.

76. The method as recited in claim 61, wherein substantially all of the metal is within the via hole.

77. The method as recited in claim 61, wherein the metal and the metallic film are the only materials in the via hole.

78. The method as recited in claim 61, wherein the metal fills a bottom portion of the via hole without filling a top portion of the via hole.

79. The method as recited in claim 61, wherein the metal has a bowl-like shape.

80. The method as recited in claim 61, wherein electroplating the metal includes initially electroplating the metal on the metallic film without electroplating the metal on the terminal pad, thereby electrically isolating the metallic film and the terminal pad, and then electroplating the metal on the metallic film and the terminal pad after the metal on the metallic film contacts the terminal pad, thereby electrically connecting the metallic film and the terminal pad.

81. A method of making a flip chip assembly, comprising the following steps in the sequence set forth:
   providing a substrate including a dielectric layer and an electrically conductive trace, wherein the dielectric layer includes first and second surfaces that are opposite one another and a via hole that extends between the first and second surfaces, and the conductive trace is disposed on the first surface;
   depositing a metallic film on sidewalls of the via hole, wherein the metallic film extends along the sidewalls to the first and second surfaces and contacts and is electrically connected to the conductive trace;
   positioning the substrate relative to a semiconductor chip, wherein the chip includes a terminal pad, the first surface faces away from the chip, the second surface faces towards the chip, and the via hole exposes the terminal pad;
   depositing a reflowable material into the via hole and on the metallic film and the terminal pad; and
   reflowing the reflowable material to provide a connection joint that electrically connects the metallic film and the terminal pad.

82. The method as recited in claim 81, wherein depositing the metallic film includes electrolessly plating the metallic film.

83. The method as recited in claim 81, wherein depositing the metallic film includes sputtering the metallic film.

84. The method as recited in claim 81, wherein depositing the metallic film includes evaporating the metallic film.

85. The method as recited in claim 81, wherein positioning the substrate relative to the chip includes attaching the substrate to the chip using an adhesive.

86. The method as recited in claim 81, wherein positioning the substrate relative to the chip includes attaching the substrate to the chip using a mechanical clamp.

87. The method as recited in claim 81, wherein positioning the substrate relative to the chip positions the via hole relative to the terminal pad such that terminal pad is directly beneath substantially all surface area defined by the via hole.

88. The method as recited in claim 81, wherein positioning the substrate to the chip positions the via hole relative to the terminal pad such that the via hole exposes the terminal pad without exposing any other terminal pad on the chip.

89. The method as recited in claim 81, wherein positioning the substrate to the chip positions the metallic film relative to the terminal pad such that the metallic film is spaced from and electrically isolated from the terminal pad.

90. The method as recited in claim 81, wherein reflowing the reflowable material includes applying energy to the reflowable material such that the reflowable material changes shape and increases its contact area with the metallic film.

91. A method of making a flip chip assembly, comprising the following steps in the sequence set forth:
   providing a substrate, including providing a dielectric layer that includes first and second surfaces that are opposite one another, forming a via hole in the dielectric layer that extends between the first and second surfaces, and forming a conductive trace on the first surface;
   depositing a metallic film on sidewalls of the via hole, wherein the metallic film extends along the sidewalls to the first and second surfaces and contacts and is electrically connected to the conductive trace;
   attaching the substrate to a semiconductor chip, wherein the chip includes a terminal pad, the first surface faces away from the chip, the second surface faces towards the chip, and the via hole is aligned with and exposes the terminal pad;
   depositing a reflowable material into the via hole and on the metallic film and the terminal pad; and
   applying energy to the reflowable material thereby transforming the reflowable material into a hardened connection joint that electrically connects the metallic film and the terminal pad.

92. The method as recited in claim 91, wherein the dielectric layer is plastic.

93. The method as recited in claim 91, wherein the dielectric layer is ceramic.

94. The method as recited in claim 91, wherein the dielectric layer is a flexible film.

95. The method as recited in claim 91, wherein forming the via hole includes drilling the dielectric layer.

96. The method as recited in claim 91, wherein forming the via hole includes etching the dielectric layer.

97. The method as recited in claim 91, wherein forming the via hole includes punching the dielectric layer.

98. The method as recited in claim 91, wherein depositing the metallic film includes electrolessly plating the metallic film.

99. The method as recited in claim 91, wherein depositing the metallic film includes sputtering the metallic film.

100. The method as recited in claim 91, wherein depositing the metallic film includes evaporating the metallic film.

101. The method as recited in claim 91, wherein attaching the substrate to the chip includes disposing an adhesive between and in contact with the dielectric layer and the chip.

102. The method as recited in claim 91, wherein attaching the substrate to the chip includes using a mechanical clamp.

103. The method as recited in claim 91, wherein attaching the substrate to the chip positions the via hole relative to the terminal pad such that terminal pad is directly beneath substantially all surface area defined by the via hole.

104. The method as recited in claim 91, wherein attaching the substrate to the chip positions the via hole relative to the terminal pad such that the via hole exposes the terminal pad without exposing any other terminal pad on the chip.

105. The method as recited in claim 91, wherein attaching the substrate to the chip positions the metallic film relative to the terminal pad such that the metallic film is spaced from and electrically isolated from the terminal pad.

106. The method as recited in claim 91, wherein substantially all of the connection joint is within the via hole.

107. The method as recited in claim 91, wherein the connection joint and the metallic film are the only materials in the via hole.

108. The method as recited in claim 91, wherein the connection joint fills a bottom portion of the via hole without filling a top portion of the via hole.

109. The method as recited in claim 91, wherein the reflowable material is solder paste.

110. The method as recited in claim 91, wherein the reflowable material is liquid solder.

111. The method as recited in claim 91, wherein the reflowable material is solder particles.

112. The method as recited in claim 91, wherein the reflowable material is epoxy.

113. The method as recited in claim 91, wherein the reflowable material is conductive polymer.

114. The method as recited in claim 91, wherein depositing the reflowable material includes printing solder paste.

115. The method as recited in claim 91, wherein depositing the reflowable material includes jetting liquid solder.

116. The method as recited in claim 91, wherein the depositing the reflowable material includes ball placement of solder particles.

117. The method as recited in claim 91, wherein applying the energy to the reflowable material includes applying heat to the reflowable material.

118. The method as recited in claim 91, wherein applying the energy to the reflowable material includes applying a laser to the reflowable material.

119. The method as recited in claim 91, wherein applying the energy to the reflowable material includes applying infrared light to the reflowable material.

120. The method as recited in claim 91, wherein applying the energy to the reflowable material causes the reflowable material to wet the metallic film and enlarge its contact area with the metallic film.

* * * * *